United States Patent
DeBrosse et al.

(10) Patent No.: US 8,828,743 B1
(45) Date of Patent: Sep. 9, 2014

(54) STRUCTURE AND FABRICATION OF MEMORY ARRAY WITH EPITAXIALLY GROWN MEMORY ELEMENTS AND LINE-SPACE PATTERNS

(71) Applicant: International Business Machines Corporation, Armonk, NY (US)

(72) Inventors: John K. DeBrosse, Colchester, VT (US); Chung H. Lam, Peekskill, NY (US); Janusz J. Nowak, New York, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/037,311

(22) Filed: Sep. 25, 2013

Related U.S. Application Data

(63) Continuation of application No. 13/835,868, filed on Mar. 15, 2013.

(51) Int. Cl.
*H01L 21/00* (2006.01)
*H01L 21/8246* (2006.01)

(52) U.S. Cl.
USPC ........................................ 438/3; 257/E21.665

(58) Field of Classification Search
CPC ..... H01L 27/222; H01L 21/77; H01L 27/105; H01L 27/108; H01L 27/11; H01L 27/112; H01L 27/115; H01L 21/8229; H01L 21/8239; H01L 27/1023; H01L 27/1024; H01L 27/1025; H01L 27/1026; H01L 27/1052; H01L 27/10802; H01L 27/10847
USPC ............ 438/3, 343, 353–355, 359, 413, 424; 257/E27.084, E27.098, E27.103, 257/E21.646, E21.661, E21.665, E21.68
See application file for complete search history.

(56) References Cited

U.S. PATENT DOCUMENTS

| | | | |
|---|---|---|---|
| 7,009,877 B1 | 3/2006 | Huai et al. | 365/171 |
| 7,212,432 B2 | 5/2007 | Ferrant et al. | 365/158 |
| 7,742,328 B2 | 6/2010 | Chen et al. | 365/158 |
| 7,968,876 B2 | 6/2011 | Lung et al. | 257/42 |
| 8,300,454 B2 | 10/2012 | Kramer et al. | 365/171 |
| 2008/0203469 A1 | 8/2008 | Gruening-von Schwerin | 257/327 |
| 2009/0180324 A1* | 7/2009 | Ramaswamy et al. | 365/185.17 |
| 2010/0181649 A1 | 7/2010 | Lung et al. | 257/588 |
| 2012/0044754 A1 | 2/2012 | DeBrosse et al. | 365/171 |

OTHER PUBLICATIONS

S. K. Gupta et al., "Layout-Aware Optimization of STT MRAMs," 2012 Design, Automation & Test in Europe Conference & Exhibition (DATE), Mar. 12-16, 2012, pp. 1455-1458.
B. Prince, "Vertical NV Memories an an Alternative to Scaling," Non-Volatile Memory Technology Symposium, NVMTS '07, Nov. 10-13, 2007, pp. 5-9.

* cited by examiner

*Primary Examiner* — Calvin Choi
(74) *Attorney, Agent, or Firm* — Ido Tuchman; Vazken Alexanian

(57) ABSTRACT

A system and method for fabricating a memory array device. An example memory array device includes a plurality of memory cells, each including a FET over a substrate and a memory element over the FET. Each memory element includes a plurality of epitaxially grown memory element layers. The memory elements formed utilizing two etches through all epitaxially grown layers. Each of these etches can be split to two separate processes specific to CMOS transistor etch and to memory element etch. The memory array device includes a plurality of gate conductors configured along a first axis, in parallel. Each FET of the memory cells adjacent to two gate conductors. The memory array device includes a plurality of bit lines configured along a second axis, in parallel, and electrically coupled to a plurality of memory elements along the second axis.

6 Claims, 15 Drawing Sheets

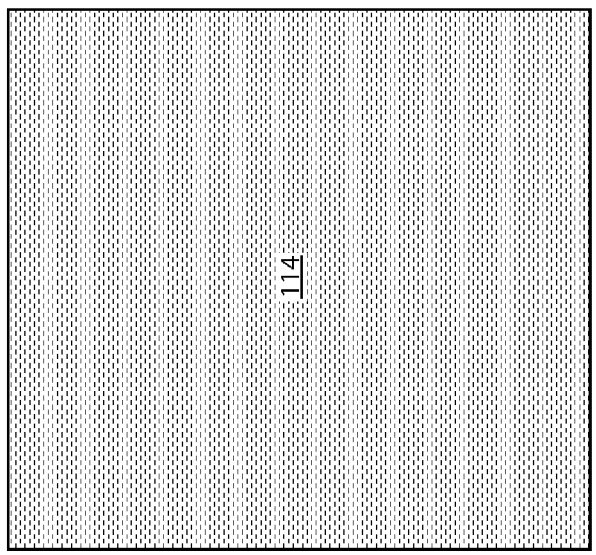
FIG. 6

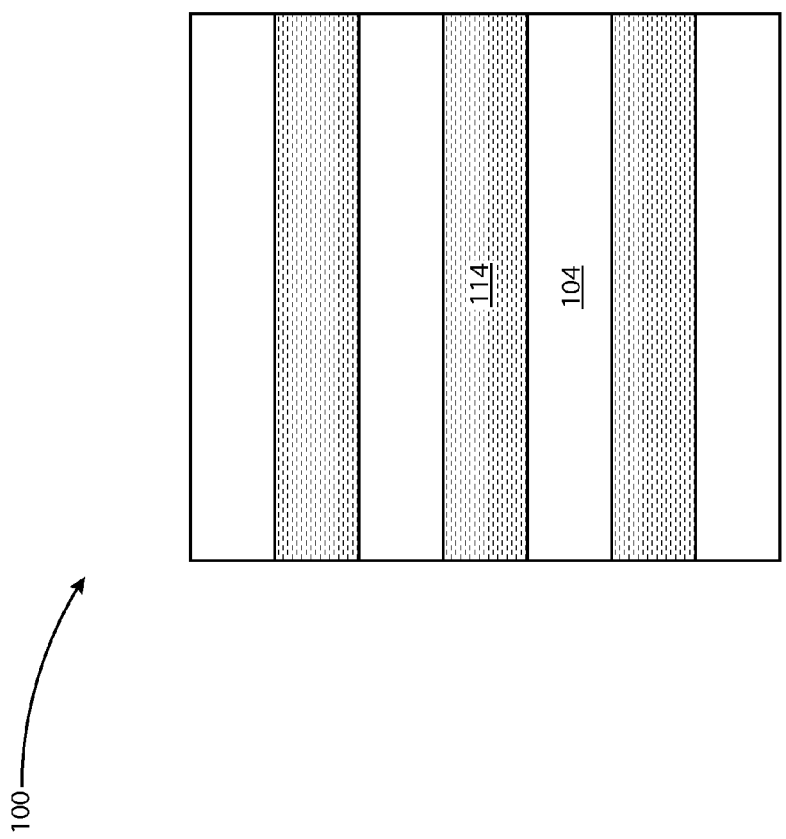

STRUCTURE AND FABRICATION OF MEMORY ARRAY WITH EPITAXIALLY GROWN MEMORY ELEMENTS AND LINE-SPACE PATTERNS

CROSS-REFERENCE TO RELATED APPLICATIONS

This application claims priority under 35 U.S.C. §120 to U.S. patent application Ser. No. 13/835,868 filed Mar. 15, 2013, the entire text of which is specifically incorporated by reference herein.

BACKGROUND OF INVENTION

The present invention relates to memory array devices. More particularly, the present invention relates to the structure and fabrication of memory element layers in non-volatile memory array devices.

Typical non-volatile memory array devices consist of memory cells fabricated on semiconductor substrates. The memory cells in such memory array devices generally consist of memory elements and field effect transistors (FET) electrically coupled to word-lines and bit-lines.

Spin Torque Transfer (STT) Magnetoresistive Random Access Memory (MRAM) is an attractive emerging memory technology, offering non-volatility, high performance and high endurance. The STT MRAM memory cell typically consists of a Magnetic Tunnel Junction (MTJ) in series with a word-line-gated field effect transistor, and with a bit-line at one or both ends. If only one end of the cell is connected to a BL, the other is connected to a mid-level voltage (Vmid). Conventionally, the FET is constructed within a silicon substrate and the MTJ is constructed between two subsequent wiring levels. The contacts, landing pads, and wiring conflicts associated with this structure decrease density, yield and reliability.

SUMMARY OF INVENTION

An aspect of the present invention is a memory array device comprising a plurality of memory cells. Each memory cell includes a FET on top of a substrate and a memory element electrically coupled to the FET. Each memory element includes a plurality of memory element layers, which are each epitaxially grown. The memory array device also includes a plurality of gate conductors configured along a first axis, parallel to one another. Each FET of the memory cells is adjacent to two gate conductors. The memory array further includes a plurality of bit lines configured along a second axis, parallel to one another and perpendicular to the gate conductors. Each bit line is electrically coupled to a plurality of memory elements along the second axis.

Another aspect of the invention is a method for fabricating a memory array device. The method includes forming a plurality of FET layers over a substrate. The method also includes forming a plurality of memory element layers over the FET layers, such that each memory element layer is epitaxially grown. The method further includes forming a plurality of memory cell pillars by etching a plurality of column trenches and row trenches through the memory element layers and FET layers. Each memory cell pillar includes a FET and a memory element. The row trenches configured along a first axis in parallel and the column trenches configured along a second axis in parallel, wherein the first axis is perpendicular to the second axis. The method also includes forming a plurality of gate conductors within the row trenches, such that each FET of the memory cell pillars is adjacent to two gate conductors. The method includes forming a plurality of bit lines configured along a second axis, parallel to one another. Each bit line is electrically coupled to a plurality of memory elements along the second axis, perpendicular to the first axis.

BRIEF DESCRIPTION OF DRAWINGS

FIG. 6 depicts a top-down view of a memory array device after forming the memory element layers, in accordance with one embodiment of the present invention.

FIG. 8 depicts a top-down view views of a memory array device after etching the column trenches through the FET layers, in accordance with one embodiment of the present invention.

DETAILED DESCRIPTION

The present invention is described with reference to embodiments of the invention, but shall not be limited to the referenced embodiments. Throughout the description of the present invention, references are made to FIGS. 1 through 15B.

It is initially noted that the environments described below and depicted in the figures are for the purpose of illustrating suggested embodiments of the present invention. Thus, the present invention should not be construed as limited to the environment configurations shown and discussed herein. Therefore, the present invention encompasses alternative orientations and configurations of the suggested embodiments.

Additionally, relative terms, such as "row", "column", "top", "down", "above", and "over" are employed with respects to other elements in the described embodiments and figures. Such terms are meant only to describe the referenced embodiments. Likewise, the figures include references to a first axis and a second axis from the claimed elements, however, the spirit of the invention is not limited by the orientations of such axis in the provided embodiments. Therefore, the present invention encompasses alternative orientations and configurations of the suggested embodiments.

Embodiments of the present invention provide possible configurations for a memory array device, and possible methods for fabricating such a memory array device. For high density MRAM memory array, all layers in magnetic tunnel junctions need to be atomically flat and have uniform thickness across all the devices. Currently, MRAM cells are typically built on top of all CMOS layers and, as a result, magnetic tunnel junctions have polycrystalline layers with random orientations of crystals. This causes a large cell to cell variation in both electric and magnetic properties of individual cells. For 20-30 nm CMOS nodes this variability presents issues in reliability and cost efficiency of making high density memory arrays. Many of these cell to cell variations can be overcome by growing a MTJ stack epitaxially layer by layer on monocrystalline semiconductor surface (Si, Ge).

Figure 1B:
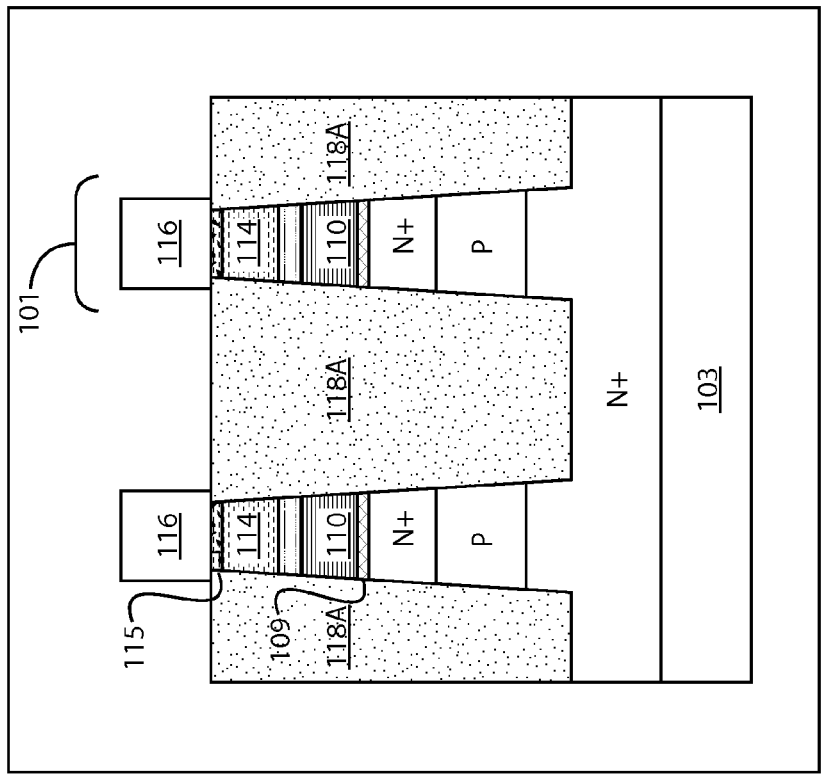
FIGS. 1A and 1B depict cross-sectional views of a memory array device, in accordance with one embodiment of the present invention.
Figure 1A:
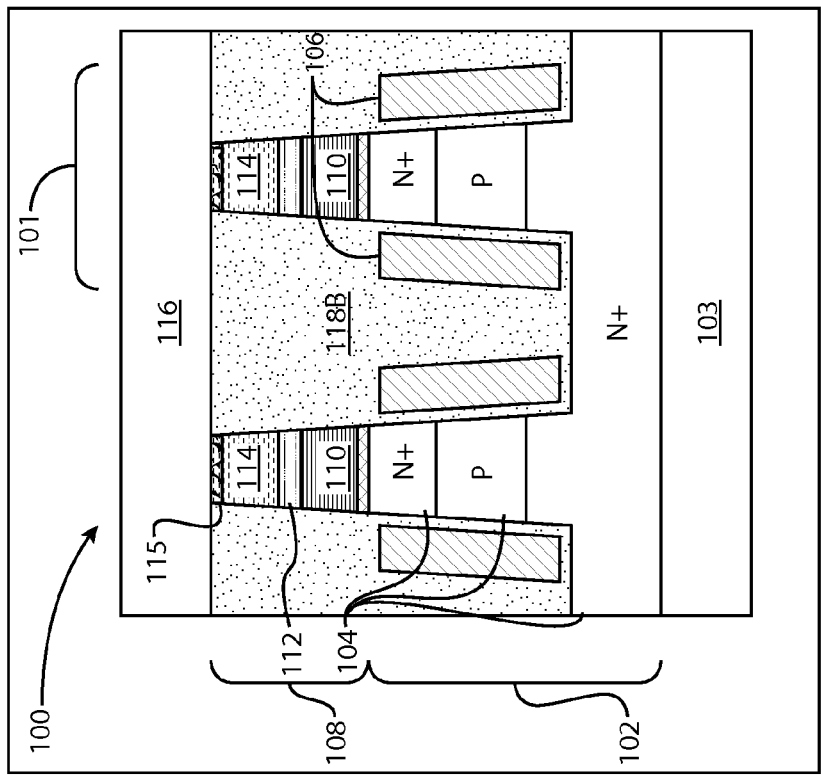

FIGS. 1A and 1B depict cross-sectional views of a memory array device 100 in accordance with one embodiment of the present invention. FIG. 1A is a cross-section through the center of a memory cell 101, parallel to the second axis. FIG. 1B is a cross-section through the center of a memory cell 101, parallel to the first axis.

The memory array device 100 includes a plurality of memory cells 101. Each memory cell 101 includes a field effect transistor (FET) 102 and a memory element 108. The FET 102 includes a plurality of FET layers 104 over a substrate 103. In the preferred embodiment, the FET layers 104 are each epitaxially grown. The FET layers 104 include alternating layers of n-type doped silicon and p-type silicon.

The memory element 108 is electrically coupled to the FET 102. Each memory element 108 includes a plurality of epitaxially grown memory element layers. In some embodiments, the memory element 108 is a Spin Torque Transfer (STT) Magnetoresistive Random-Access Memory (MRAM) cell. In such embodiments, the memory element 108 includes a magnetic tunnel junction (MTJ), which includes a free-magnetic layer 110, a tunnel barrier 112, and a fixed-magnetic layer 114. In some embodiments, the crystalline structure of the free-magnetic layer 110 is aligned epitaxially to the FET layer below. The free-magnetic layer 110 and fixed-magnetic layer 114 may be comprised of ferromagnetic materials, such as cobalt iron boron (CoFeB), cobalt nickel (CoNi), iron boron (FeB), etc. The fixed-magnetic layer 114 may also include antiferromagnetic materials, cobalt iron (CoFe), iron nickel (FeNi), nickel oxide (NiO), etc. The tunnel barrier 112 may be comprised of insulating or semiconducting materials, such as magnesium oxide (MgO), aluminum oxide (AlO), hafnium oxide (HfO), iron oxide (FeO), bismuth iron oxide (BiFeO), etc.

Embodiments of the present invention high provide a density memory array by using two separate etches to form a memory element. Both etches go through all epitaxially oriented layers forming a CMOS transistor at the bottom and a memory element on the top. Each of these etches can be split to two separate processes specific to CMOS transistor etch and to memory element etch. In a first step, parallel lines are formed, which are then cut into squares in the second etch step.

In this embodiment, a seed layer 109 exists between the FET 102 and the memory element 108. The seed layer 109 is comprised of many sub-layers, some sub-layers may only be atomically thick and not continuous. For example, a first sub-layer may provide ohmic contact, a second sub-layer may compensate for crystal lattice mismatch and a third sub-layer may promote perpendicular anisotropy in the free-magnetic layer 110. Additionally, there may be several monolayers in between the sub-layers. The monolayers configured to promote layer by layer growth of the whole structure.

In this embodiment, the free-magnetic layer 110 is situated above the FET 102, the tunnel barrier 112 over the free-magnetic layer 110, and the fixed-magnetic layer 114 situated above the tunnel barrier 112. However, it should be noted that alternate embodiments may exist wherein the free-magnetic layer 110 is situated over the tunnel barrier 112, the tunnel barrier 112 over the fixed-magnetic layer 114, and the fixed-magnetic layer 114 situated over the FET 102.

The memory array device 100 also includes a plurality of gate conductors 106 configured along a first axis (running in/out of FIG. 1A), parallel to one another. In this embodiment, the gate conductors 106 are utilized as the conductive channels of the word lines. Each FET 102 of the memory cells 101 is adjacent to two gate conductors 106A/106B. One skilled in the arts would recognize that the gate conductors 106 may include any number of conductive materials. As such, the gate conductors 106 provide electrical coupling of adjacent memory cells along the first axis. It should be noted that a thin gate oxide may be situated between the gate conductor 106 and the FET 102.

The memory array device 100 also includes a plurality of bit lines 116 configured along a second axis (running horizontally across FIG. 1A and in/out of FIG. 1B), parallel to one another. Each bit line 116 is electrically coupled to a plurality of memory elements 108 of the memory cells along the second axis. The second axis being perpendicular to the first axis.

Additionally, the memory array device 100 may include a metallic cap layer 115 between the memory element 108 and the bit lines 116. The metallic cap layer 115 configured to protect the memory element 108 from damage during fabrication. One skilled in the arts would recognize that the metallic cap layer 115 may be comprised of any number of conducting materials.

In this embodiment, the space between the gate conductors 106 is substantially less than the space between the bit lines 116. The space between the memory cells 101 are filled with column fillers 118A and row fillers 118B.

Figure 2:
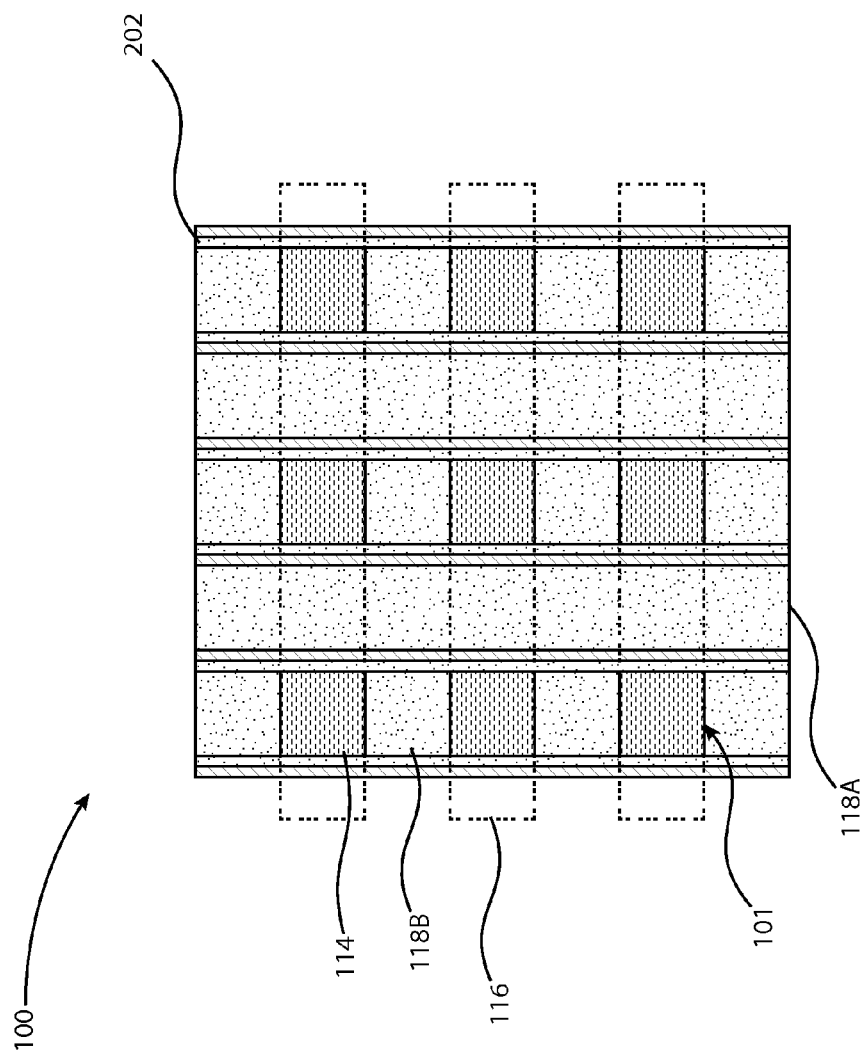
FIG. 2 depicts a top-down view of a memory array device, in accordance with one embodiment of the present invention.

FIG. 2 depicts a top-down view of memory array device 100, in accordance to one embodiment of the present invention. This figure depicts the embodiment of FIG. 1 from a top-down perspective. As depicted, this embodiment includes a gate oxide 202 between the memory cells 101 and the gate conductors 106. In some embodiments, the column fillers 118A, row fillers 118B, and gate oxide 202 are comprised of a similar dielectric material, such that all three elements may exist as continuous insulator.

Figure 3:
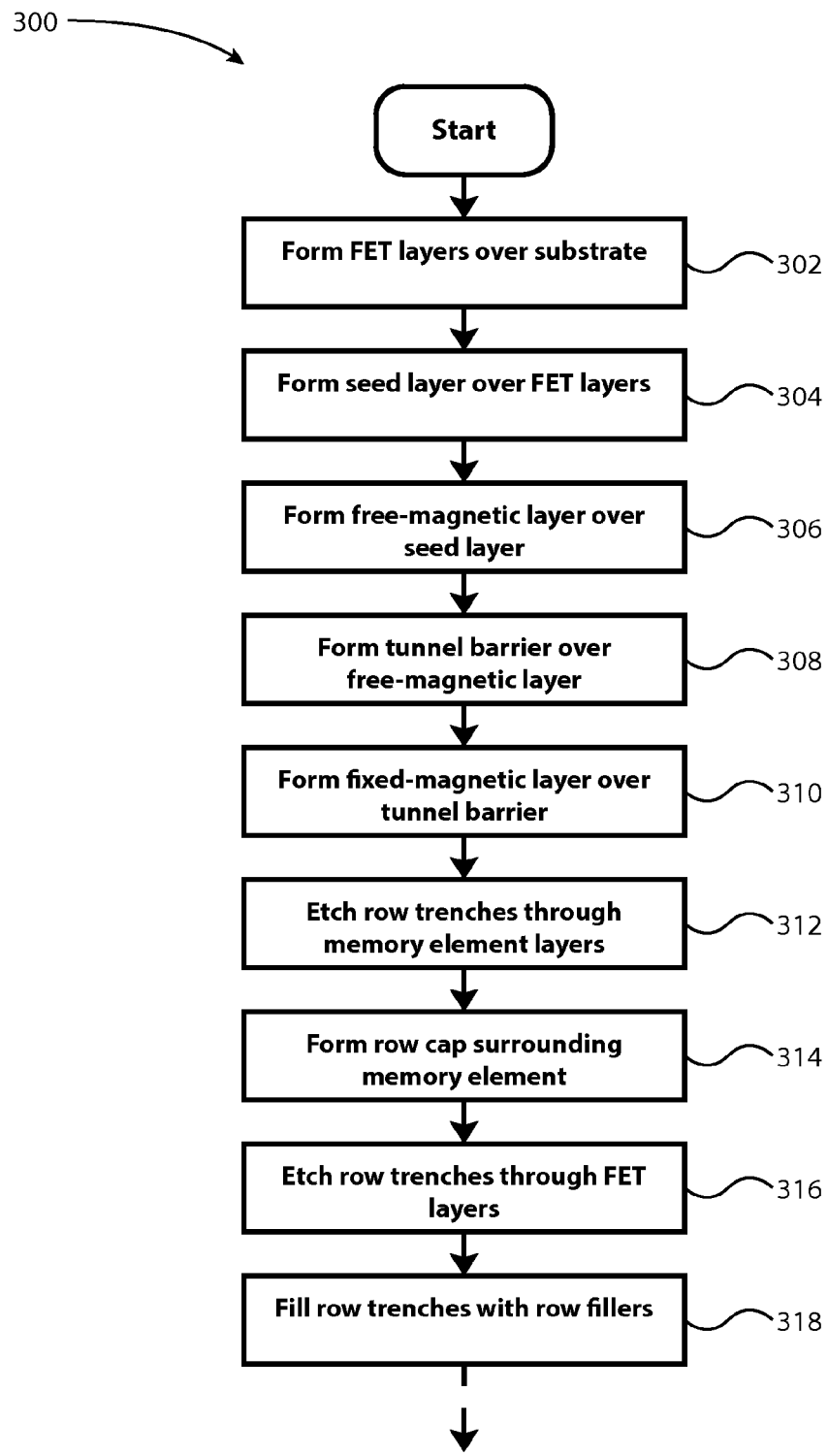
FIGS. 3 and 4 are flowcharts depicting a method for fabricating a memory array device 100, in accordance with one embodiment of the present invention.
Figure 4:
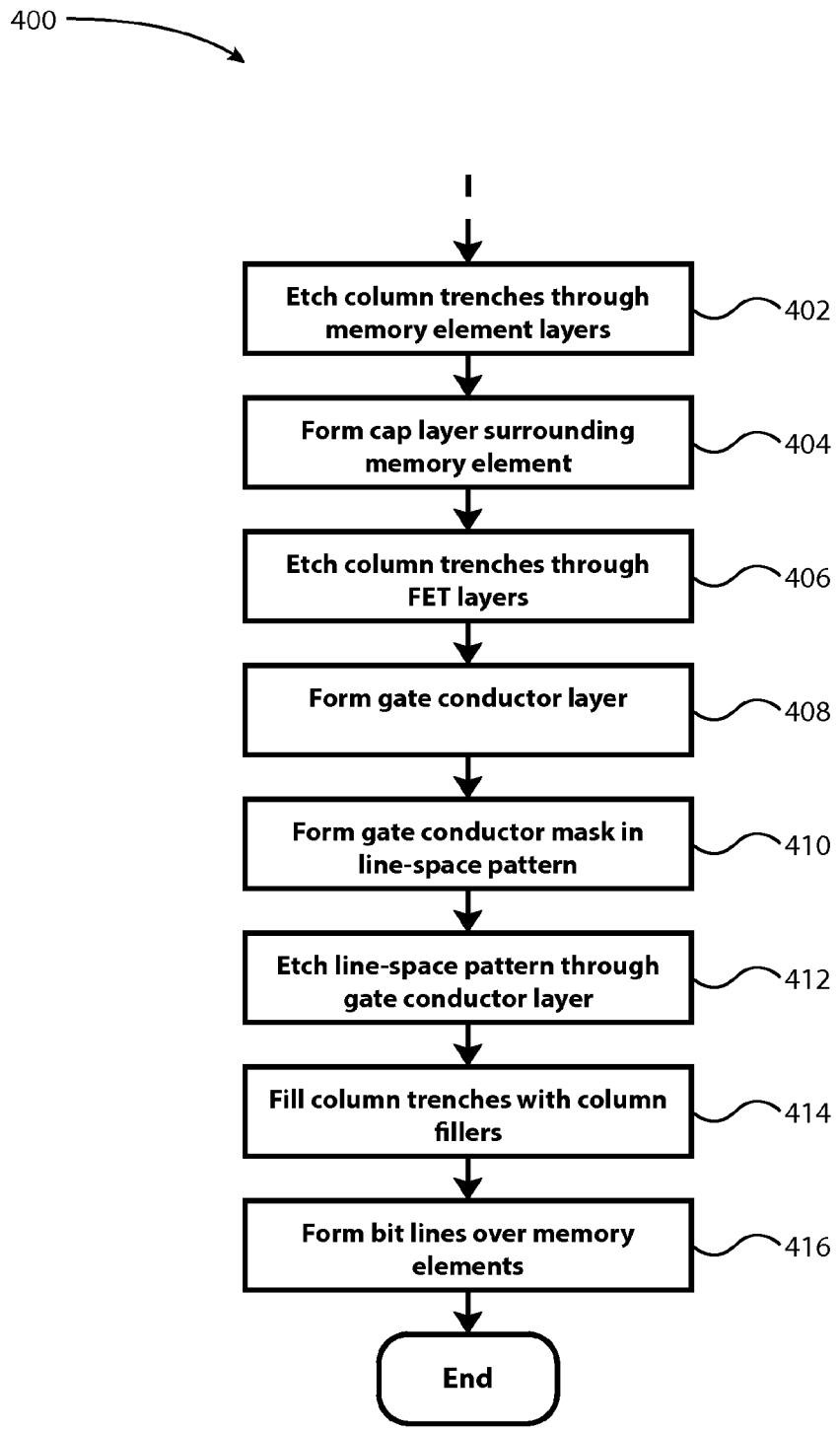

FIGS. 3 and 4 are flowcharts depicting a method for fabricating a memory array device 100, in accordance with one embodiment of the present invention. The method begins with forming step 302. At forming step 302, the plurality of field effect transistor (FET) layers 104 are formed over a substrate 103. The FET layers 104 can be formed by successively doping the substrate 103 material to produce alternating n-type and p-type semiconductor layers. The FET layers 104 may be epitaxially formed. After forming step 302, the method proceeds to forming step 304.

At forming step 304, the seed layer 109 is formed over the FET layers 104. As mentioned above, the seed layer 109 is configured to promote magnetic anisotropy for the memory element layers and provide ohmic contact between the FET 102 and the memory element 108. After forming step 304, the method proceeds to forming step 306.

At forming step 306, the free-magnetic layer 110 is epitaxially grown over the seed layer 109. Epitaxial growth may be achieved through various techniques including variations of chemical vapor deposition (CVD) or atomic layer deposition (ALD). After forming step 306, the method proceeds to forming step 308. At forming step 308, the tunnel barrier 112 is epitaxially grown over the free-magnetic layer 110. As mentioned above, the tunnel barrier can be comprised of insulating or semiconducting materials. In order to compensate for mismatch between the crystal lattices of the free-magnetic layer 110 and tunnel barrier 112 and to enhance tunnel magneto resistance, sub-nanometer thick amorphous CoFeB layers can be used on both sides of the tunnel barrier 112. After forming step 308, the method proceeds to forming step 310. At forming step 310, the fixed-magnetic layer 114 is epitaxially grown over the tunnel barrier 112. In this embodiment, the metallic cap layer 115 is formed over the fixed-magnetic layer 114. After forming step 310, the method proceeds to etching step 312.

At etching step 312, a column mask is formed over the memory element layers and the column trenches 702 (later depicted in FIG. 7) are etched through the memory element layers. In this embodiment, the column mask is formed directly over the fixed-magnetic layer 114. The column mask is patterned as line-space pattern to define the column trenches 702. One skilled in the art would recognize that the column mask may be formed utilizing many different techniques, including conductive and non-conductive hard masks, or photolithographic processes. After etching step 312, the method proceeds to forming step 314.

At forming step 314, the column cap is formed surrounding the memory elements 108. The column cap may be comprised from a dielectric material. In some embodiments, the column cap is conformally deposited and directionally etched. After forming step 314, the method proceeds to etching step 316.

At etching step 316, the column trenches 702 are etched through the FET layers 104. The column mask layer be removed after the etch processes. After etching step 316, the method proceeds to filling step 318. At filling step 318, column fillers 118A are formed within the column trenches 702 equal to the height of the memory cells 101. After filling step 318, the method proceeds to etching step 402.

At etching step 402, a row mask is formed over the memory element layers and the row trenches 1102 (later depicted in FIG. 11) are etched through portions of the memory element layers and column fillers 118A, defining the memory elements 108. In this embodiment, the row mask is formed directly over the fixed-magnetic layer 114. The row mask is patterned as line-space pattern to define the row trenches 1102. One skilled in the art would recognize that the row mask may be formed utilizing many different techniques, including conductive and non-conductive hard masks, or photolithographic processes. After etching step 402, the method proceeds to forming step 404.

At forming step 404, the row cap is formed surrounding the memory elements 108. The row cap may be comprised of the same material as the column cap. As such, the column caps and the row caps together form an encapsulation layer 1504 (later depicted in FIGS. 15A and 15B) surrounding each memory element 108. The encapsulation layer 1504 may be designed as an encapsulation layer, protecting the sidewalls of the memory elements 108 during the subsequent etches. Additionally, the encapsulation layer 1504 may be configured to decrease the capacitance between the gate conductors 106 and the memory elements 108. The encapsulation layer 1504 may also be utilized as a mask to produce FETs 102 with diameters substantially larger than the memory elements 108. In some embodiments, the row cap is conformally deposited and directionally etched. After forming step 404, the method proceeds to etching step 406.

At etching step 406, the row trenches 1102 are etched through the FET layers 104 and portions of the column fillers 118A, forming the FETs 102. The row mask layer may be removed after the etch processes. After etching step 406, the method proceeds to forming step 408.

At forming step 408, a gate oxide and gate conductor layer is formed over and around the memory cell pillars. The gate conductor layer is planarized and recessed below the height of the memory element 108, such that the gate conductor layer is divided into several portions situated in the row trenches 1102. After forming step 408, the method proceeds to forming steps 410.

At forming step 410, a gate conductor mask is formed over the gate conductor layer in a line-space pattern. After forming step 410, the method proceeds to etching step 412. At etching step 412, the line-space pattern is etched into the gate conductor layer, defining each of the gate conductors 106 as a rectangle adjacent to a plurality of memory cells 101 along the first axis, such that each memory cell 101 is adjacent to two gate conductors. After etching step 412, the method proceeds to forming step 414.

At filling step 414, row fillers 118B are formed within the row trenches 1102 equal to the height of the memory cells 101. After filling step 414, the method proceeds to forming step 416. At forming step 416, the bit lines 116 are formed along the second axis, in parallel. One skilled in the art would recognize that many techniques may be utilized to form the bit lines, including damascene and subtractive etch methods. The bit lines 116 each electrically coupled to a plurality of memory elements 108 along the second axis. As mentioned above, the second axis is perpendicular to the first axis. After forming step 416, the method is complete.

Thus, the memory cell can be entirely defined by line-space patterns. In a particular embodiment, the cell structure is defined by only three lithographic masks (isolation trench 1 (column trench), isolation trench 2 (row trench), and bit line), all of which are simple line-space patterns. This contributes greatly to the low cost, high density and excellent scaling characteristics of this cell structure. Specifically, line-space patterns are strongly preferred over dot, hole or other type patterns by lithographers for optical reasons. Thus, a memory cell defined solely by line-space lithographic patterns is very advantageous.

Figure 5B:
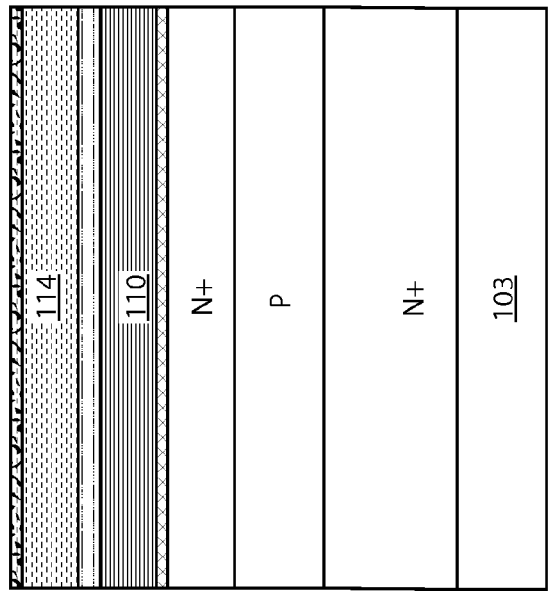
FIGS. 5A and 5B depict cross-sectional views of a memory array device after forming the memory element layers, in accordance with one embodiment of the present invention.
Figure 5A:
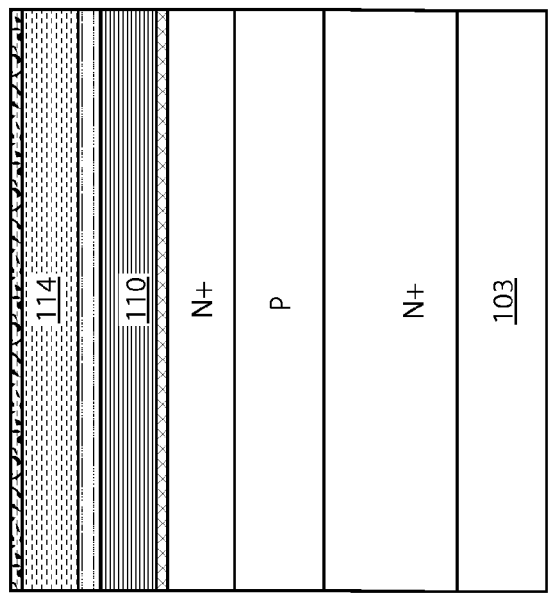

FIGS. 5A and 5B depict cross-sectional views of a memory array device after forming the memory element layers, in accordance with one embodiment of the present invention. FIG. 5A is a cross-section through the center of a memory cell 101, parallel to the second axis. FIG. 5B is a cross-section through the center of a memory cell 101, parallel to the first axis. As depicted, the free-magnetic layer 110, the tunnel barrier 112, and the fixed-magnetic layer 114 are each epitaxially grown over unpatterned FET layers 104 and substrate 103.

FIG. 6 depicts a top-down view of a memory array device after forming the memory element layers, in accordance with one embodiment of the present invention. FIG. 6 corresponds to the embodiment depicted in FIGS. 5A and 5B.

Figure 7B:
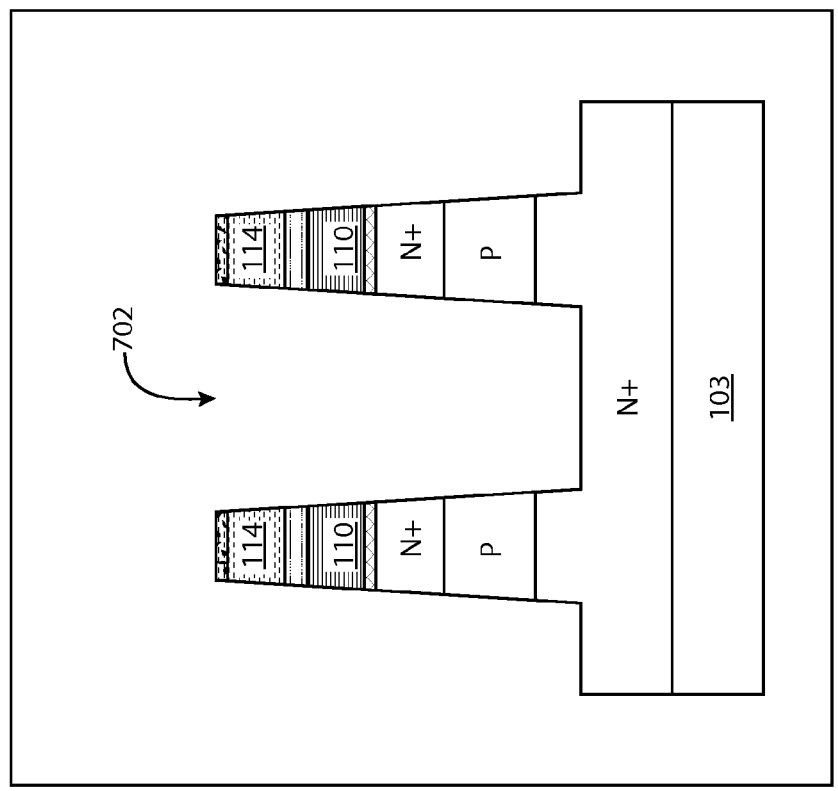
FIGS. 7A and 7B depict cross-sectional views of a memory array device after etching the column trenches through the FET layers, in accordance with one embodiment of the present invention.
Figure 7A:
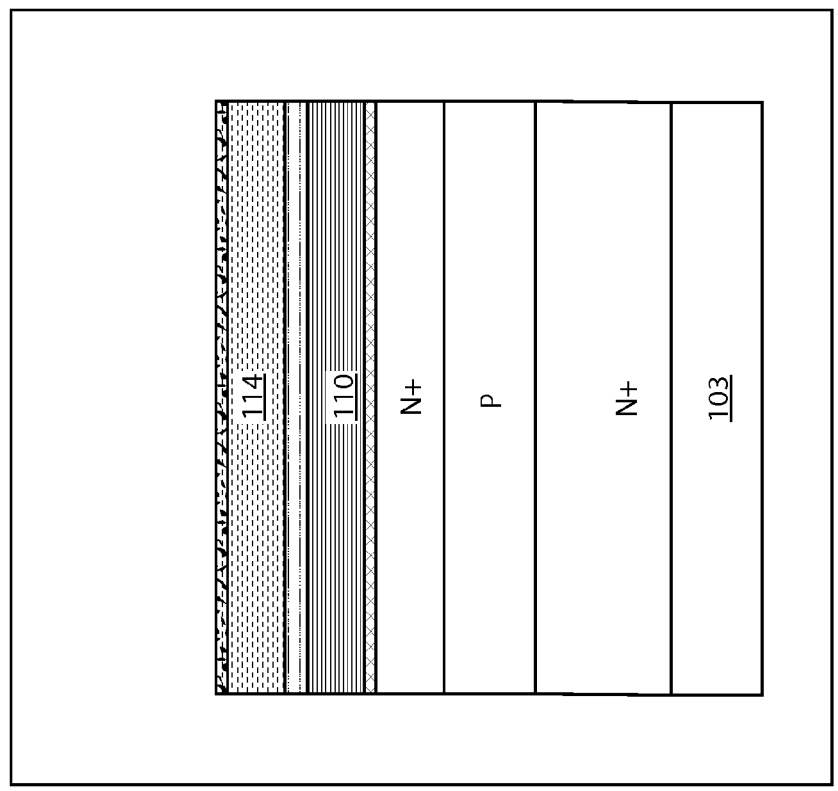

FIGS. 7A and 7B depict cross-sectional views of a memory array device after etching the column trenches through the FET layers, in accordance with one embodiment of the present invention. FIG. 7A is a cross-section through the center of a memory cell 101, parallel to the second axis. FIG. 7B is a cross-section through the center of a memory cell 101, parallel to the first axis. In this embodiment, the column trenches 702 are etched down through most of the FET layers 104.

FIG. 8 depicts a top-down view views of a memory array device after etching the column trenches through the FET layers, in accordance with one embodiment of the present invention. FIG. 8 corresponds to the embodiment depicted in FIGS. 7A and 7B.

Figure 9B:
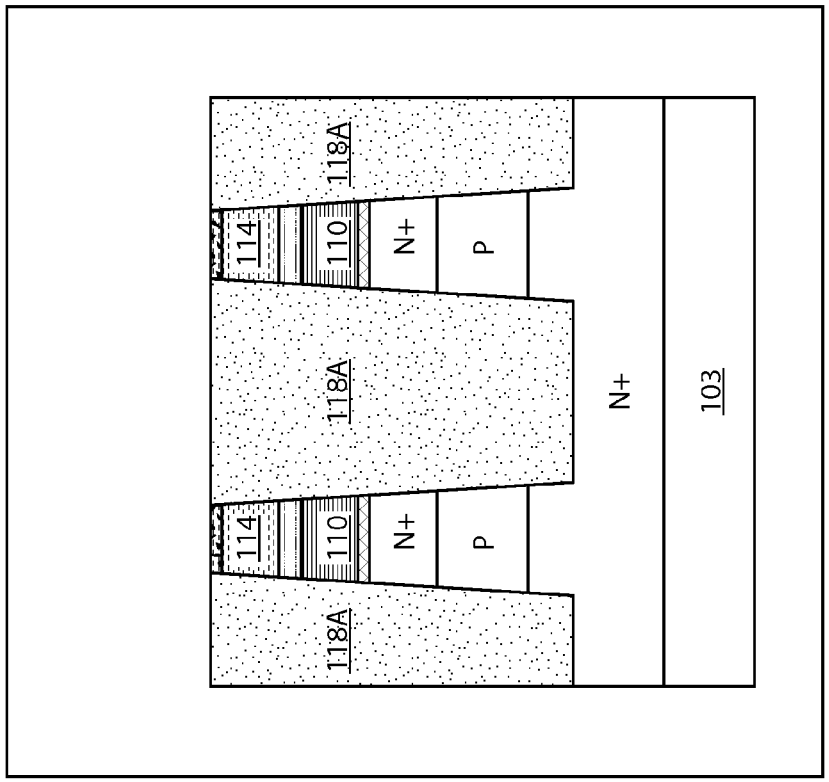
FIGS. 9A and 9B depict cross-sectional views of a memory array device after filling the column trenches with column fillers, in accordance with one embodiment of the present invention.
Figure 9A:
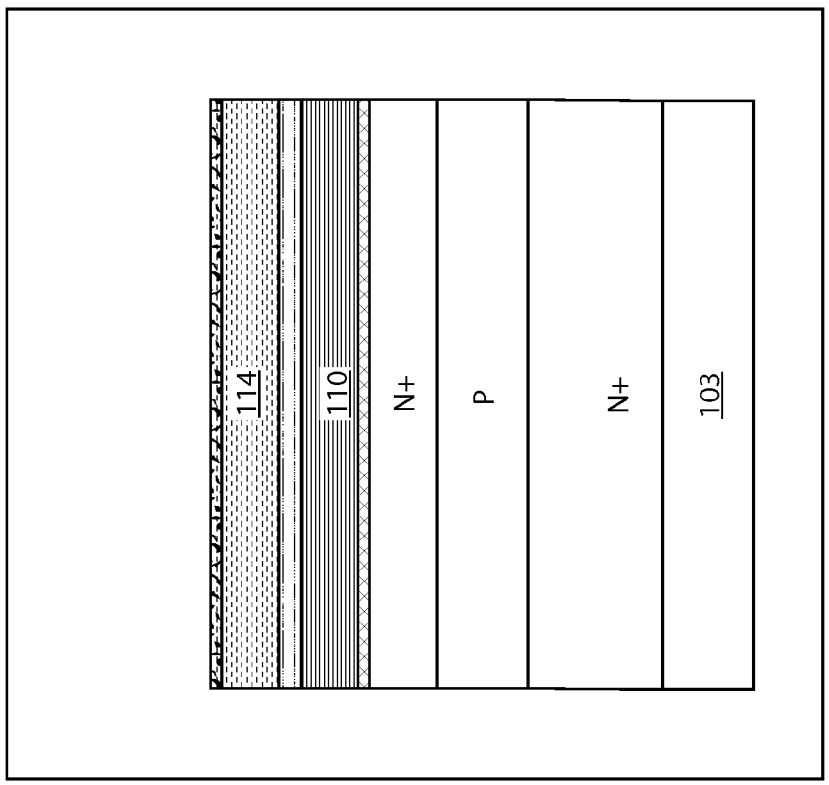

FIGS. 9A and 9B depict cross-sectional views of a memory array device after filling the column trenches 702 with column fillers 118A, in accordance with one embodiment of the present invention. FIG. 7A is a cross-section through the center of a memory cell 101, parallel to the second axis. FIG. 7B is a cross-section through the center of a memory cell 101, parallel to the first axis. Many techniques may be utilized to form the column fillers 118A, including a combination of deposition and planarization processes.

Figure 10:
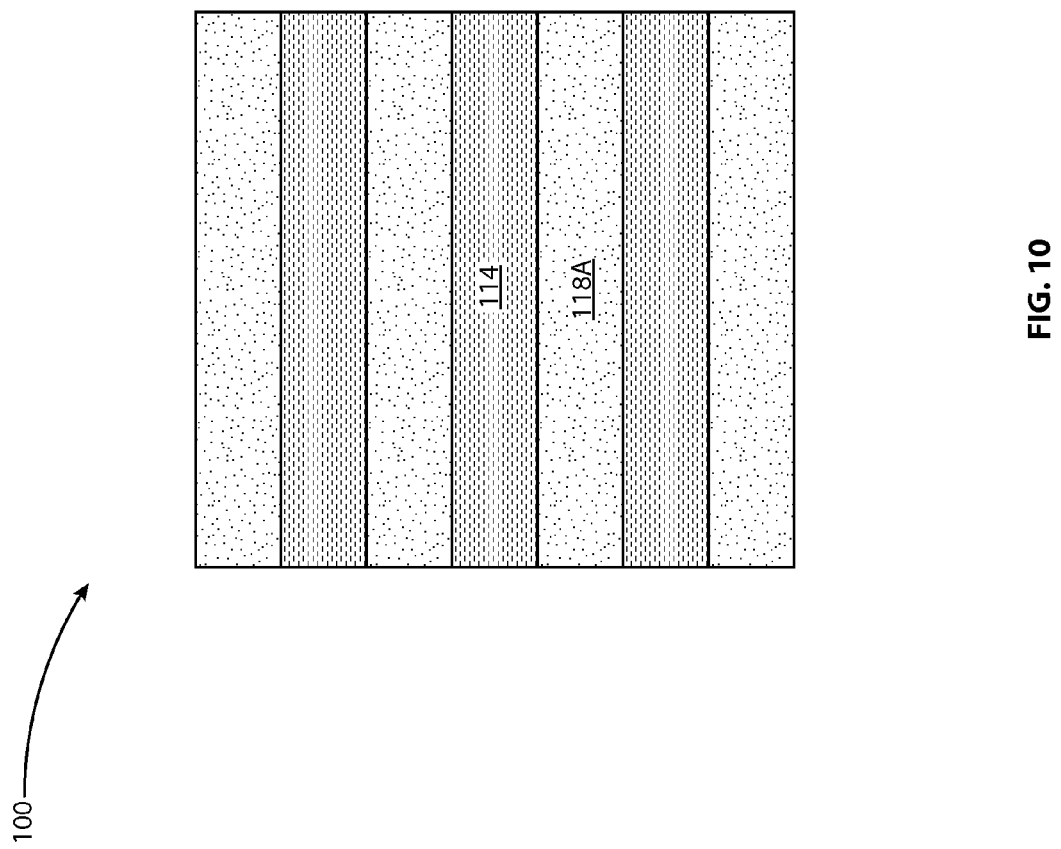
FIG. 10 depicts a top-down view of a memory array device after filling the column trenches with column fillers, in accordance with one embodiment of the present invention.

FIG. 10 depicts a top-down view of a memory array device after filling the column trenches 702 with column fillers 118A, in accordance with one embodiment of the present invention. FIG. 10 corresponds to the embodiment depicted in FIGS. 9A and 9B.

Figure 11B:
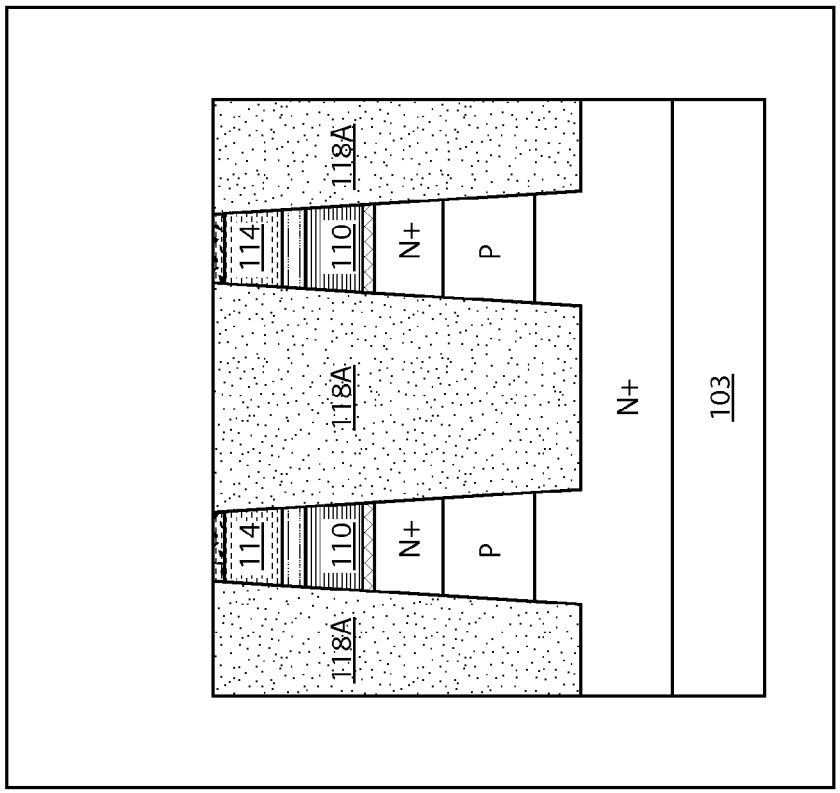
FIGS. 11A and 11B depict cross-sectional views of a memory array device after etching the row trenches through the FET layers, in accordance with one embodiment of the present invention.
Figure 11A:
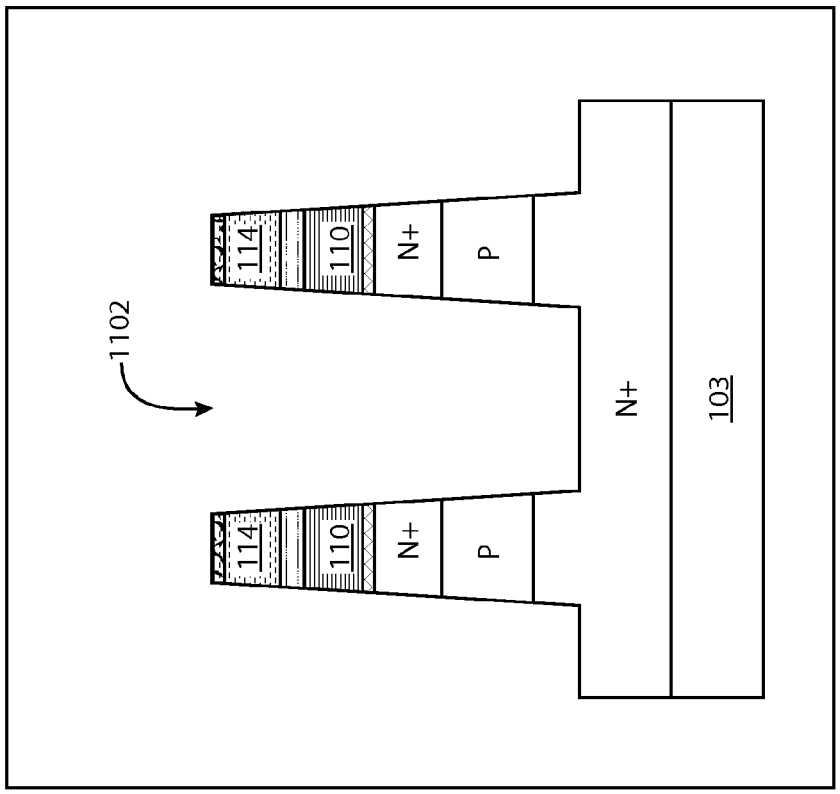

FIGS. 11A and 11B depict cross-sectional views of a memory array device after etching the row trenches 1102 through the FET layers 104, in accordance with one embodiment of the present invention. FIG. 11A is a cross-section through the center of a memory cell 101, parallel to the second axis. FIG. 11B is a cross-section through the center of a memory cell 101, parallel to the first axis. In this embodiment, the row trenches 1102 are etched down through most of the FET layers 104. At this point, the FETs 102 and memory elements 108 are defined as memory cell pillars.

Figure 12:
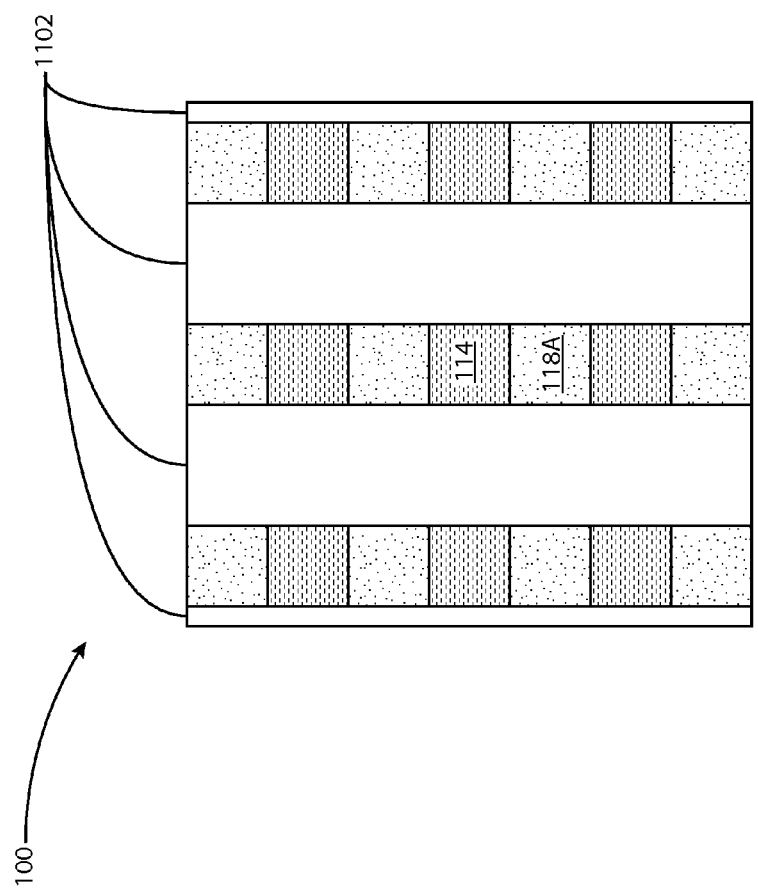
FIG. 12 depicts a top-down view views of a memory array device after etching the row trenches through the FET layers, in accordance with one embodiment of the present invention.

FIG. 12 depicts a top-down view views of a memory array device after etching the row trenches 1102 through the FET layers 104, in accordance with one embodiment of the present invention. FIG. 12 corresponds to the embodiment depicted in FIGS. 11A and 11B.

Figure 13B:
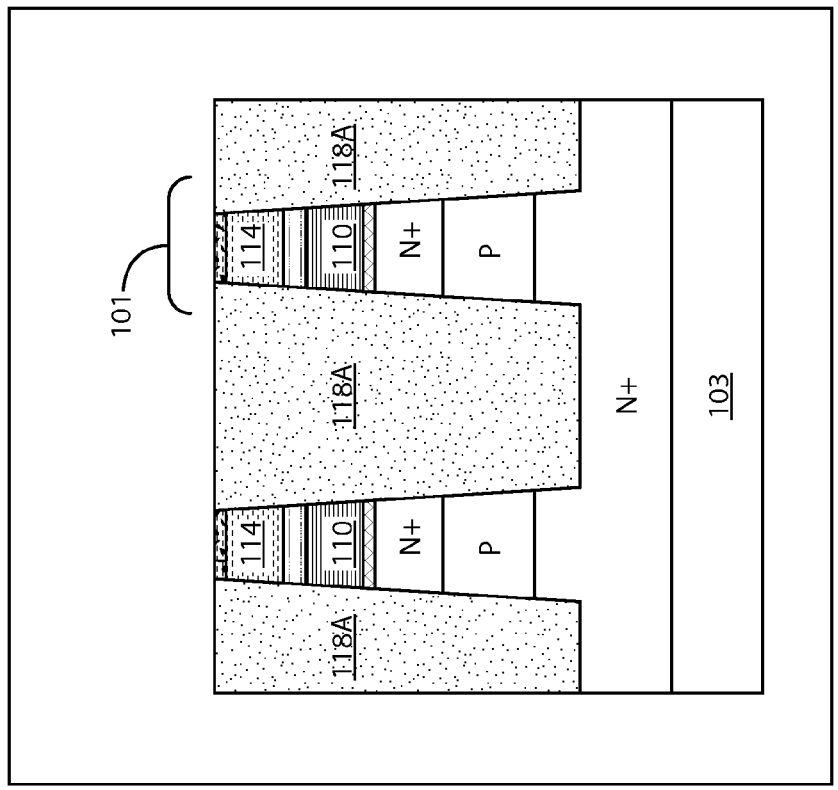
FIGS. 13A and 13B depict cross-sectional views of a memory array device after filling the row trenches with row fillers, in accordance with one embodiment of the present invention.
Figure 13A:
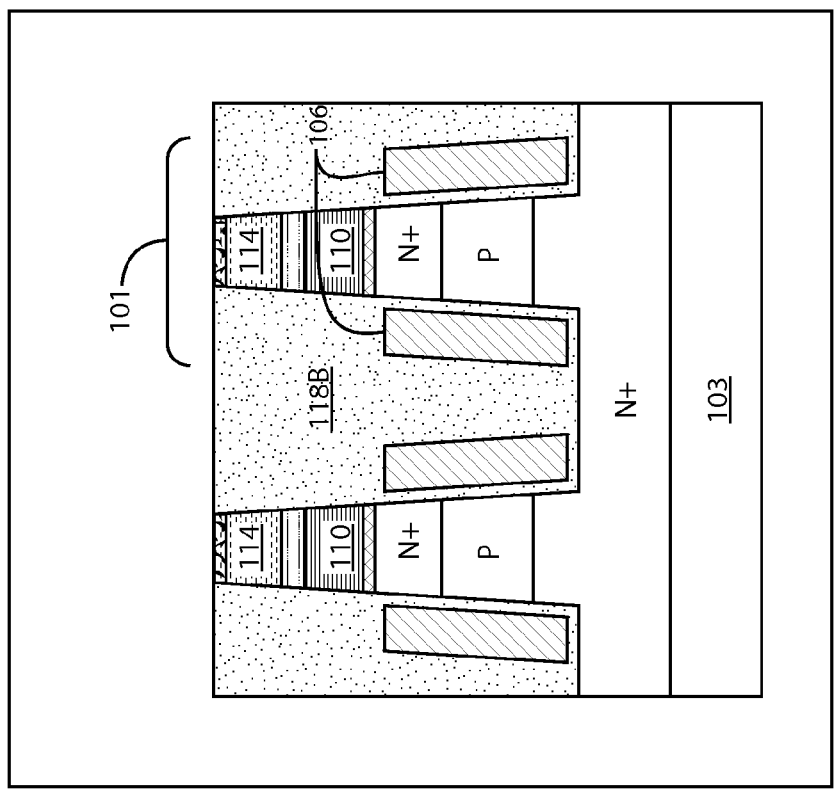

FIGS. 13A and 13B depict cross-sectional views of a memory array device after filling the row trenches 1102 with row fillers 118B, in accordance with one embodiment of the present invention. FIG. 13A is a cross-section through the center of a memory cell 101, parallel to the second axis. FIG. 13B is a cross-section through the center of a memory cell 101, parallel to the first axis. In this embodiment, the row fillers 118B, column fillers 118A, and gate oxide 202 are comprised of the same material.

Figure 14:
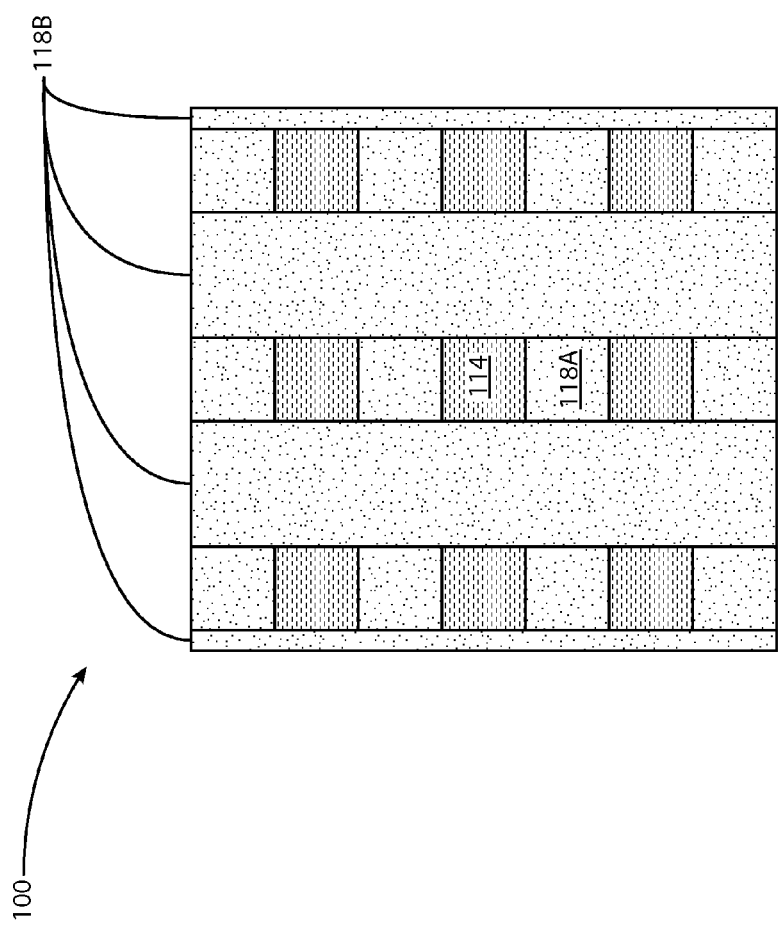
FIG. 14 depicts a top-down view of a memory array device after filling the row trenches with row fillers 118B, in accordance with one embodiment of the present invention.

FIG. 14 depicts a top-down view of a memory array device after filling the row trenches 1102 with row fillers 118B, in accordance with one embodiment of the present invention. FIG. 14 corresponds to the embodiment depicted in FIGS. 13A and 13B.

Figure 15A:
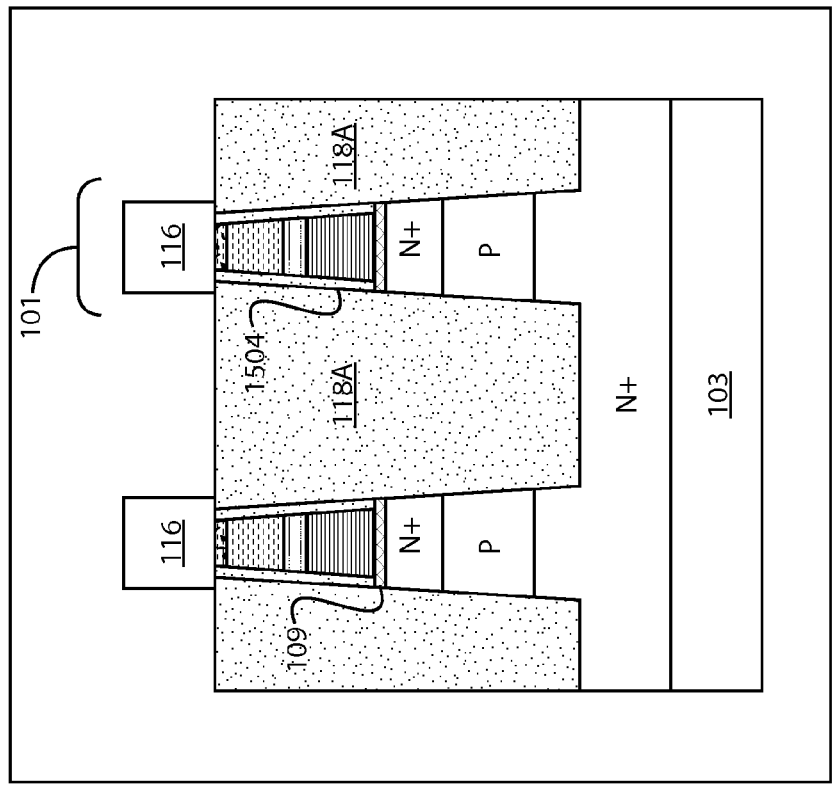
FIGS. 15A and 15B depict a cross-sectional view of a memory array device including a seed layer and encapsulation layer, in accordance with one embodiment of the present invention.
Figure 15B:
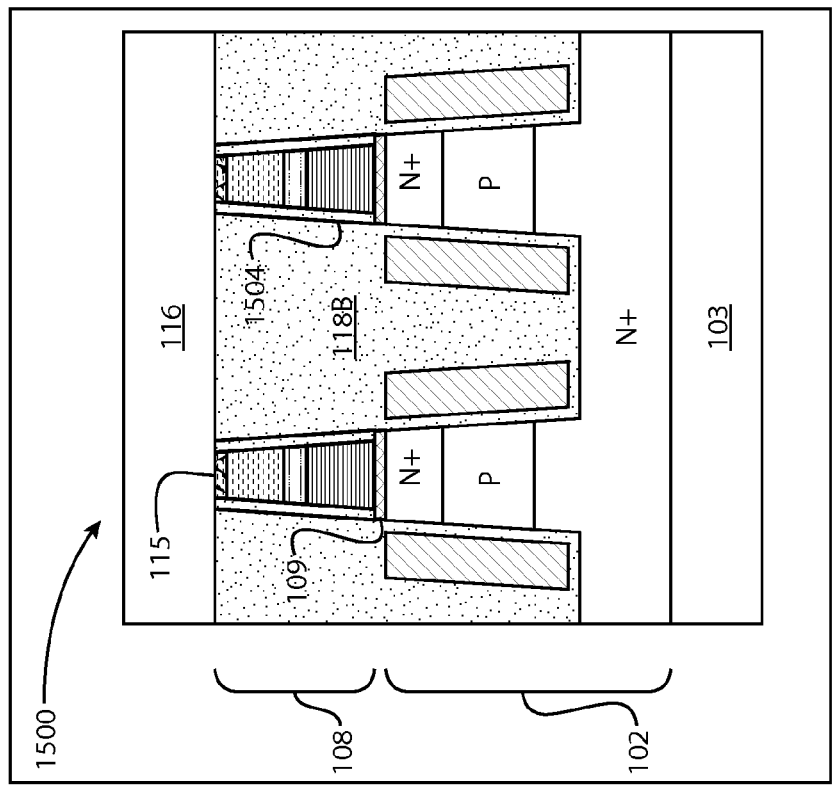

FIGS. 15A and 15B depict a cross-sectional view of a memory array device 1500, in accordance to one embodiment of the present invention. In some embodiments, each memory cell 101 includes a seed layer 109 between the memory element 108 and the FET 102. The seed layer 109 is configured to promote a matching lattice in the memory element and the FET 102. The seed layer 109 may also provide ohmic contact between the FET 102 and the memory element 108. In this embodiment, the seed layer 109 is also configured to promote perpendicular magnetic anisotropy for the free-magnetic layer 110. The seed layer 109 may be comprised of many materials including but not limited to aluminum (Al), magnesium oxide (MgO), nickel silicide (NiSi), and cobalt silicide (CoSi).

This embodiment also includes an encapsulation layer 1504 surrounding the memory element 108. The encapsulation layer 1504 may be configured to protect the memory element 108 during the etch processes. Additionally, the encapsulation layer 1504 may be configured to decrease the capacitance between the memory element 108 and the gate conductors 106. In some embodiments, the diameters of the FETs 102 are substantially greater than the diameters of the memory elements 108.

The flowcharts and diagrams in the figures illustrate the architecture, functionality, and fabrication of possible implementations of a memory array device according to various embodiments of the present invention. It should be noted that, in some alternative implementations, the fabrication steps depicted in the flowchart and description may occur out of the order noted, depending upon the functionality involved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a memory array device comprising:
    forming a plurality of field effect transistor (FET) layers over a substrate;
    forming a plurality of memory element layers over the plurality of FET layers, wherein each of the memory element layers is epitaxially grown;
    forming a plurality of memory cell pillars by etching a plurality of column trenches and row trenches through the memory element layers and FET layers, such that each memory cell pillar includes a FET and a memory element, the row trenches configured along a first axis in parallel and the column trenches configured along a second axis in parallel, wherein the first axis is perpendicular to the second axis;
    forming a plurality of gate conductors within the row trenches, such that each FET of the memory cell pillars is adjacent to two gate conductors;
    forming a plurality of bit lines configured along the second axis in parallel, wherein each bit line is electrically coupled to a plurality of memory elements along the second axis
    forming a seed layer over the FET layer;
    epitaxially growing a free-magnetic layer over the seed layer, the free-magnetic layer including a ferromagnetic material;
    epitaxially growing a tunnel barrier over the free-magnetic layer, the tunnel barrier including a multiferroic material, wherein the tunnel barrier being situated between the free-magnetic and fixed-magnetic layers; and epitaxially growing a fixed-magnetic layer over the tunnel barrier, the fixed-magnetic layer including at least one of a ferromagnetic material and an antiferromagnetic material.

2. The method of claim 1, wherein etching the plurality of column trenches further comprises:
  patterning a column mask over the memory element layers in a line-space pattern along the second axis;
  etching the column trenches through a portion of the memory element layers;
  forming a plurality of column caps within the column trenches adjacent to the memory element layers; and
  etching the column trenches through a portion of the FET layers.

3. The method of claim 1, wherein etching the plurality of row trenches further comprises:
  patterning a row mask over the memory element layers in a line-space pattern along the first axis;
  etching the row trenches through a portion of the memory element layers to form the memory elements;
  forming a plurality of row caps within the row trenches adjacent to the memory elements; and
  etching the column trenches through the FET layers to form the FETs, such that at least one dimension of the memory elements is less than the FETs.

4. The method of claim 1, wherein forming the plurality of gate conductors further comprises:
  depositing a gate conductor layer over the memory cell pillars and within the row trenches;
  planarizing the gate conductor layer;
  recessing the gate conductor layer into the row trenches;
  forming a gate photoresist mask in a line-space pattern along the first axis; and
  etching the line-space pattern through the gate conductor layer to form the plurality of gate conductors, such that each gate conductor is defined as a rectangle adjacent to a plurality of FETs along the first axis.

5. The method of claim 1, further comprising:
  forming a plurality of column fillers in the column trenches prior to etching the plurality of row fillers; and
  forming a plurality of row fillers in the row trenches prior to forming the plurality of bit lines.

6. The method of claim 1, wherein the FET layers are epitaxially grown.

* * * * *